US009761343B2

(12) United States Patent
Frantz et al.

(10) Patent No.: US 9,761,343 B2
(45) Date of Patent: Sep. 12, 2017

(54) BARIUM COPPER SULFUR FLUORIDE TRANSPARENT CONDUCTIVE THIN FILMS AND BULK MATERIAL

(71) Applicants: Jesse A. Frantz, Landover, MD (US); Jasbinder S. Sanghera, Ashburn, VA (US); Vinh Q. Nguyen, Fairfax, VA (US); Woohong Kim, Lorton, VA (US); Ishwar D. Aggarwal, Charlotte, NC (US)

(72) Inventors: Jesse A. Frantz, Landover, MD (US); Jasbinder S. Sanghera, Ashburn, VA (US); Vinh Q. Nguyen, Fairfax, VA (US); Woohong Kim, Lorton, VA (US); Ishwar D. Aggarwal, Charlotte, NC (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 407 days.

(21) Appl. No.: 14/245,025

(22) Filed: Apr. 4, 2014

(65) Prior Publication Data
US 2014/0220357 A1 Aug. 7, 2014

Related U.S. Application Data

(62) Division of application No. 13/412,692, filed on Mar. 6, 2012, which is a division of application No. (Continued)

(51) Int. Cl.
C23C 14/00 (2006.01)
H01B 1/06 (2006.01)
(Continued)

(52) U.S. Cl.
CPC .............. H01B 1/06 (2013.01); C01B 9/08 (2013.01); C23C 14/06 (2013.01); C23C 14/3414 (2013.01); C23C 14/5806 (2013.01); Y10T 428/31533 (2015.04); Y10T 428/31721 (2015.04); Y10T 428/31786 (2015.04)

(58) Field of Classification Search
CPC ..................................................... C23C 14/06
See application file for complete search history.

(56) References Cited

U.S. PATENT DOCUMENTS

| 6,700,058 | B2* | 3/2004 | Nelles | C07C 217/92 136/256 |
| 2001/0005554 | A1* | 6/2001 | Nakamura | G02B 1/10 428/461 |
| 2005/0151131 | A1* | 7/2005 | Wager, III | H01L 31/0272 257/51 |

OTHER PUBLICATIONS

H. Yanagi. "P-type conductivity in transparent oxides and sulfide fluorides." 2003. Journal of Solid State Chemistry. 175. 34-38.*

(Continued)

Primary Examiner — Timon Wanga
(74) Attorney, Agent, or Firm — US Naval Research Laboratory; Rebecca L. Forman

(57) ABSTRACT

A p-type transparent conductive material can comprise a thin film of BCSF on a substrate where the film has a conductivity of at least 1 S/cm. The substrate may be a plastic substrate, such as a polyethersulfone, polyethylene terephthalate, polyimide, or some other suitable plastic or polymeric substrate.

4 Claims, 4 Drawing Sheets

Related U.S. Application Data

12/250,808, filed on Oct. 14, 2008, now Pat. No. 8,158,096.

(60) Provisional application No. 61/098,390, filed on Sep. 19, 2008.

(51) Int. Cl.
*C01B 9/08* (2006.01)
*C23C 14/06* (2006.01)
*C23C 14/34* (2006.01)
*C23C 14/58* (2006.01)

(56) References Cited

OTHER PUBLICATIONS

J. Frantz. "Formation of a new phase of barium copper sulfer fluoride via sputtering." Apr. 2008. Materials Letters.*
R. Pöttgen. "Materials with ZrCuSiAs-Type Structure." Naturforsch. 63b (2008) 1135-1148.*

* cited by examiner

BARIUM COPPER SULFUR FLUORIDE TRANSPARENT CONDUCTIVE THIN FILMS AND BULK MATERIAL

CROSS-REFERENCE TO RELATED APPLICATIONS

The present application is a divisional application of U.S. application Ser. No. 13/412,692, filed on Mar. 6, 2012 by Jesse A. Frantz et al., entitled "BARIUM COPPER SULFUR FLUORIDE TRANSPARENT CONDUCTIVE THIN FILMS AND BULK MATERIAL," which was a divisional application of U.S. application Ser. No. 12/250,808, filed on Oct. 14, 2008 by Jesse A. Frantz et al., entitled "BARIUM COPPER SULFUR FLUORIDE TRANSPARENT CONDUCTIVE THIN FILMS AND BULK MATERIAL" (now U.S. Pat. No. 8,158,096), which claimed priority from U.S. Provisional Application No. 61/098,390, filed on Sep. 19, 2008 by Jesse A. Frantz et al., entitled "BARIUM COPPER SULFUR FLUORIDE TRANSPARENT CONDUCTIVE THIN FILMS AND BULK MATERIAL," the entire contents of each are incorporated herein by reference.

BACKGROUND OF THE INVENTION

Field of the Invention

The present invention relates generally to transparent conductive materials and more particularly to barium copper sulfur fluoride transparent conductive thin films and bulk materials.

Description of the Prior Art

Films consisting of transparent conductors (TC's) with p-type charge carriers (p-TC's) are desirable for several applications including multijunction solar cells, transparent electronics, low operating voltage light-emitting diodes, high-efficiency solar cells, and electro-magnetic interference (EMI) shielding. Moreover, transparent conductive coatings that can be deposited on plastic substrates are desirable for many applications, for example, wearable computers, lightweight displays, higher-efficiency emissive displays, large-area displays, and improved solar cells.

Current p-TC films have several problems. Most materials that exhibit p-TC behavior are poor conductors with typical conductivities of <1 S/cm. The best current p-TC films have conductivities as high as 220 S/cm at room temperature, but these films require high processing temperatures (at least 400° C.). Therefore, they are incompatible with organic optoelectronic materials and exhibit interdiffusion when heated while in contact with other inorganic films. In addition, many existing methods of forming high-conductivity p-TC films require the use of single-crystal substrates such as MgO, making them impractical for most applications.

Barium copper sulfur fluoride (BCSF) is a crystalline material that, in the prior art, consists of alternately stacked fluorite and anti-fluorite layers that form a tetragonal crystal structure in space group P4/nmm. Bulk BCSF compound is intrinsically p-type, and when doped with potassium, it has been shown to possess bulk conductivity as high as 100 S/cm in selected crystals.

One method for producing BCSF thin films is described in the following reference, the entire contents of which are incorporated herein by reference: Yanagi, Park, Draeske, Keszler, and Tate, "P-type conductivity in transparent oxides and sulfide fluorides," *J. Solid State Chem.*, 175, 34-38 (2003) (hereinafter referred to as the Yanagi article). As described in the reference, the authors co-evaporated Cu metal and $BaF_2$ onto $SiO_2$ and MgO substrates. They then treated the films under flowing $H_2S$ gas. The resulting films had conductivities of only ~0.1 S/cm at room temperature.

Bulk BCSF

There are currently two general methods for fabricating bulk BCSF. The first method entails heating precursors in a sealed quartz ampoule. As described in Zhu, Huang, Wu, Dong, Chen, and Zhao, "Synthesis and crystal structure of barium copper fluorochalcogenides: [BaCuFQ (Q=S,Se)]," *Materials Research Bull.*, 29, 505-508 (1994), the entire contents of which are incorporated herein by reference, precursors CuS, BaS, Cu, and $BaF_2$ were pressed into pellets and heated to 450° C. for 12 hours in a sealed quartz ampoule. The second method does not make use of a sealed ampoule. Some examples of the second method are described in the Yanagi article. In one example, the precursors $Cu_2S$, BaS, and $BaF_2$ were heated to 450° C. for 15 hours. In another example, $BaCO_3$, $Cu_2S$, and $BaF_2$ are used as precursors. In these examples, the precursors were heated to 550° C. for an unspecified period of time under flowing $H_2S$ gas in a refractory boat rather than a sealed ampoule. The following article, the entire contents of which are incorporated herein by reference, describes another example in which precursors $BaCu_2S_2$ and $BaF_2$ were heated to 650° C. for 15 hours: Park, Keszler, Yanagi, and Tate, "Gap modulation in $MCu[Q_{1-x}Q'_x]F$ (M=Ba, Sr; Q,Q'=S, Se, Te) and related materials," *Thin Solid Films*, 445, 288-293 (2003).

None of these methods produces good quality BCSF. The quartz ampoule method results in residual quantities of the precursors within the bulk material. This effect may be mitigated by pressing the precursors into pellets prior to baking. Although this technique helps, it does not solve the problem. In addition, this technique adds an extra processing step and may be impractical for large quantities of material. Furthermore, placing the precursors directly in contact with the quartz ampoule can result in chemical reactions between the precursors and the ampoule and lead to contamination with oxides. The second method requires treatment under flowing $H_2S$ gas—a step that is potentially hazardous and may be impractical for large quantities of material.

P-TC Thin Films on Plastic Substrates

Both p-TC's and TC's with n-type charge carriers (n-TC's) are desired in order to form a variety of transparent electronic and opto-electronic devices. While several n-TC's that can be deposited on plastic substrates are well-established, such as indium tin oxide, zinc oxide, and amorphous In—Ga—Zn—O, there are no available p-TC's with comparable conductivities.

Currently, there are only a few p-TC's that are compatible with plastic substrates. One existing approach is to use organic thin films. While this approach has resulted in both n-TC's and p-TC's, their conductivities are generally lower than desirable, and these materials are typically subject to environmental degradation. Another possible approach is to use an inorganic material. Most existing inorganic p-TC's require deposition at high temperatures (>300° C.). Some require single-crystal substrates that act as a template for crystalline film growth. Either of these requirements makes the use of plastic substrates impossible with the exception of the amorphous semiconductor, $a\text{-}ZnO.Rh_2O_3$, as reported in Harushima, Mizoguchi, Shimizu, Ueda, Ohta, Hirano, and Hosono, "A p-type amorphous oxide semiconductor and room temperature fabrication of amorphous oxide p-n heterojunction diodes," *Advanced Materials*, 15, 1409-1413, the entire contents of which are incorporated herein by reference. However, these films possess electrical conductivity of only 2 S/cm, approximately three orders of magnitude lower than that of indium tin oxide. Higher conductivity p-TC's are needed for efficient, low operating voltage devices.

BRIEF SUMMARY OF THE INVENTION

The aforementioned problems are overcome in the present invention which provides a bulk barium copper sulfur fluoride (BCSF) material made by combining $Cu_2S$, BaS and $BaF_2$, heating the ampoule between 400 and 550° C. for at least two hours, and then heating the ampoule at a temperature between 550 and 950° C. for at least two hours. The BCSF material may be doped with potassium, rubidium, or sodium. The present invention also provides for a BCSF transparent conductive thin film made by forming a sputter target by either hot pressing bulk BCSF or hot pressing $Cu_2S$, BaS and $BaF_2$ powders and sputtering a BCSF thin film from the target onto a substrate. The present invention is further directed to a p-type transparent conductive material comprising a thin film of BCSF on a substrate where the film has a conductivity of at least 1 S/cm. The substrate may be a plastic substrate, such as a polyethersulfone, polyethylene terephthalate, polyimide, or some other suitable plastic or polymeric substrate.

The present invention has many advantages over the prior art. For bulk BCSF, by placing the precursors within a vitreous carbon crucible, the reactants are isolated from the quartz ampoule which prevents contamination with oxides from the ampoule. Additionally, the two-step baking schedule results in negligible amounts of residual unreacted precursors, such as $BaF_2$, which eliminates the need for pressing the material into pellets before baking or sulfurdizing the material under flowing $H_2S$ and thus considerably lowers processing costs. In contrast, BCSF produced by existing methods may contain more than 5 mole percent unreacted $BaF_2$ or may require pressing the material into pellets prior to baking or sulfurdizing the material under flowing $H_2S$. Moreover, for doped BCSF, the two-step baking schedule may allow the KF or other doping material to be incorporated into the material rather than deposited on the walls of the ampoule.

For BCSF thin films, the method of the present invention may result in an improvement in conductivity of at least two orders of magnitude over existing methods. Also, the proposed method is compatible with a large variety of crystalline and non-crystalline substrates. Additionally, the BCSF films exhibit transparency from the visible to the infrared portion of the electromagnetic spectrum out to a wavelength of at least 13 μm.

For BCSF thin films on plastic substrates, the method of the present invention permits deposition at low temperatures that is compatible with plastic substrates. Additionally, the films possess higher conductivity than other p-TC's that are compatible with plastic substrates. Moreover, BCSF films may possess better environmental stability than typical organic transparent conductive thin films.

These and other features and advantages of the invention, as well as the invention itself, will become better understood by reference to the following detailed description, appended claims, and accompanying drawings.

DETAILED DESCRIPTION OF THE INVENTION

Figure 1:
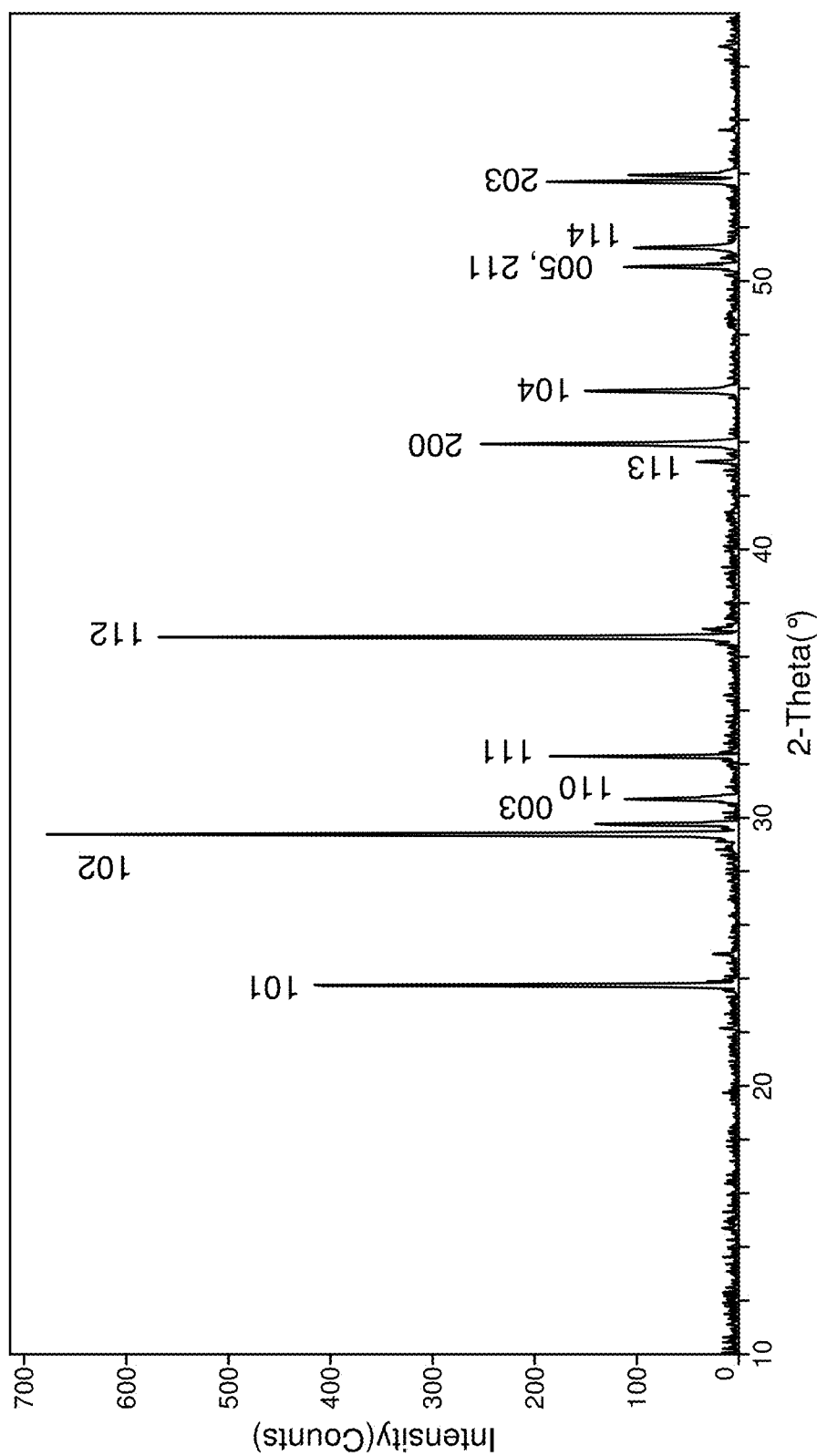
FIG. 1 shows the x-ray diffraction (XRD) data for undoped BCSF.

The present invention generally relates to a method of fabricating bulk BCSF. It also relates to BCSF films that exhibit conductivities at room temperature of at least 1 to 10 S/cm, which is at least 10 times higher than existing methods. They are typically deposited at 100° C. but can be deposited at temperatures as low as room temperature. A 250 nm thick film on a silica substrate exhibits a peak transmittance of about 80% in the visible region of the electromagnetic spectrum. Moreover, the present invention allows the film stoichiometry to be carefully controlled by controlling target composition.

One embodiment of the present invention is for fabricating BCSF films by hot pressing the starting materials into a sputtering target. The sputtering target can be hot pressed from bulk BCSF compound or it can be hot-pressed from BCSF precursors, skipping the step of making bulk BCSF compound.

Another embodiment of the present invention is for increasing the conductivity of BCSF films with a post-deposition water treatment. Typically, the films are soaked in water and baked at a temperature of at least 80° C. Films with conductivities as high as 800 S/cm have been made with this method.

A further embodiment of the present invention is for the formation of p-TC films of BCSF on plastic substrates. BCSF films with conductivity as high as 134 S/cm have been deposited on polyethersulfone (PES) substrates at a temperature of 100° C. during deposition. This conductivity is a factor of more than 65 times that of prior methods. Films may be formed on other plastics, such as polyethylene terephthalate (PET) and polyimide substrates, at room temperature.

Another embodiment of this invention is for BCSF films and bulk materials. Alternatively, BaCuQF (where Q=Se, Te) may be fabricated by the same method. Also, SrCuQF (where Q=S, Se, Te) may be fabricated by the same method. Additionally, to alter the bandgap of the material, some combination of S, Se, and Te could be used to form $BaCuS_xSe_yTe_{1-x-y}F$ or $SrCuS_xSe_yTe_{1-x-y}F$.

Target Fabrication from Bulk BCSF Compound

To fabricate undoped bulk BCSF, the precursors $Cu_2S$, BaS, and $BaF_2$ are batched in stoichiometric proportions in a nitrogen-purged glove box. The powders are ground and mixed thoroughly until the mixture appears homogeneous. The mixture is placed in a vitreous carbon crucible inside a quartz ampoule, and the ampoule is sealed under vacuum.

The sealed ampoule is placed in a furnace and is heated in a two step process. The first step is a 400-550° C. bake for at least two hours, preferably using a temperature between 450 and 500° C. for about ten hours. The second step is a higher temperature (550-950° C.) bake for at least two hours, preferably using a temperature between 600 and 700° C. for about 95 hours. This step drives the reaction to completion, consuming the precursors. Optionally, a small quantity of sulfur (around 0.1 percent of the mass of the batch or greater) could be placed within the ampoule but outside of the carbon crucible so that during baking, a sulfur atmosphere is present within the ampoule. This may help to control sulfur content in the product. If making Se and/or Te containing material, then Se and/or Te can be placed in a similar location to provide their respective atmospheres.

To fabricate doped BCSF the same processing method described above is followed except that K, Rb, or Na is substituted for Ba by including KF, RbF, or NaF in the batch and adjusting the proportion of $BaF_2$ to maintain approximate stoichiometric proportions. For example, 2.5 to 10 atomic percent of K can be substituted for Ba by including KF in the batch and adjusting the proportion of $BaF_2$. Alternatively, $K_2S$, $Rb_2S$, or $Na_2S$ can be included in the batch and the proportion of BaS adjusted to maintain approximate stoichiometric proportions. As an alternative, the dopant may be uniformly mixed with un-doped BCSF prior to hot pressing instead of forming doped BCSF and then hot pressing the material.

FIG. 1 shows an x-ray diffraction plot of an undoped BCSF sample demonstrating that the sample is predominantly the BCSF phase. In addition, no $SiO_2$ or other oxide impurities were observed. The bulk BCSF was then hot pressed into a 3 inch diameter disk that could be used as a sputtering target.

It was observed that if only the low temperature bake was used, a large amount (approximately 50 mole %) of the $BaF_2$ remained unreacted. If only the second step was used, a somewhat smaller but still significant amount (approximately 15 mole %) of the $BaF_2$ remained unreacted. In addition, if only the high temperature step was used when making K-doped BCSF, much of the KF failed to be incorporated into the material and was instead deposited on the walls of the ampoule. When both baking steps were used, an insignificant amount of the $BaF_2$ remained unreacted and the KF was successfully incorporated into the material.

Target Fabrication from BCSF Precursors

A sputter target can be formed by hot pressing $Cu_2S$, BaS, and $BaF_2$ powders (in stoichiometric proportions) into a disk (such as a three inch diameter disk), which can be done under vacuum. To create p-doped material, K, Rb, or Na is substituted for Ba by including KF, RbF, or NaF in the batch and adjusting the proportion of $BaF_2$ to maintain approximate stoichiometric proportions. Alternatively, $K_2S$, $Rb_2S$, or $Na_2S$ can be included in the batch and the proportion of BaS adjusted to maintain approximate stoichiometric proportions. For example, the following amounts were used for a 4 gram batch: 1.27847 g $Cu_2S$, 1.267 g $BaF_2$, 1.3607 g BaS, and 0.0933 g KF.

Alternatively, rather than using one target that includes all of the precursors, multiple targets—each comprising one or more of the precursors—may be used. In this case, the power to each target could be adjusted independently so that the relative sputter rate of each could be controlled. This would allow for control of the stoichiometry of the film without the need for fabricating a new sputtering target. Additionally, this method may potentially increase the film's conductivity.

The duration and temperature of the hot pressing process are carefully chosen so that sufficient chemical bonds form to make the target solid and robust. They are intentionally chosen, however, to be small enough so that an insignificant amount of BCSF forms due to a solid state reaction. As a result, the target consists of an intimate mixture of the precursor powders. The fraction of Ba, Cu, S, F, and K can be altered by adjusting the ratio of the precursors.

A sample processing schedule using $Cu_2S$, BaS, $BaF_2$, and KF precursors is as follows: ramp at a rate of 5° C./min. to 550° C.; apply pressure of 3,600 psi and hold for about an hour; ramp down to 470° C. and release pressure; hold for about 2 hours (to allow target to anneal); and then ramp at 1° C./min. to room temperature.

BCSF Film Fabrication

Deposition can be carried out by RF magnetron sputtering in a sputter-up geometry onto a substrate. The deposition system used had a base pressure of $1\times10^{-7}$ T. Deposition was carried out in an Ar atmosphere with a pressure of 5 mT and an Ar flow rate of 20 sccm. The substrate temperature ranged from room temperature up to 250° C., with the best results being obtained at a temperature around 100° C. RF power of approximately 50 W was used, resulting in an energy density of approximately 1 $W/cm^2$. The resulting deposition rate was 9 Å/min. Deposition times were up to 15 hours. A typical sample is as follows: 2 inch diameter silica sample, substrate temperature of 100° C., RF power of 50 W, deposition time of 7 hours, resulting sample thickness of 350 nm. Annealing of films in vacuum, in an inert atmosphere, or under flowing $H_2S$ gas may be used to increase film conductivity.

Figure 2:
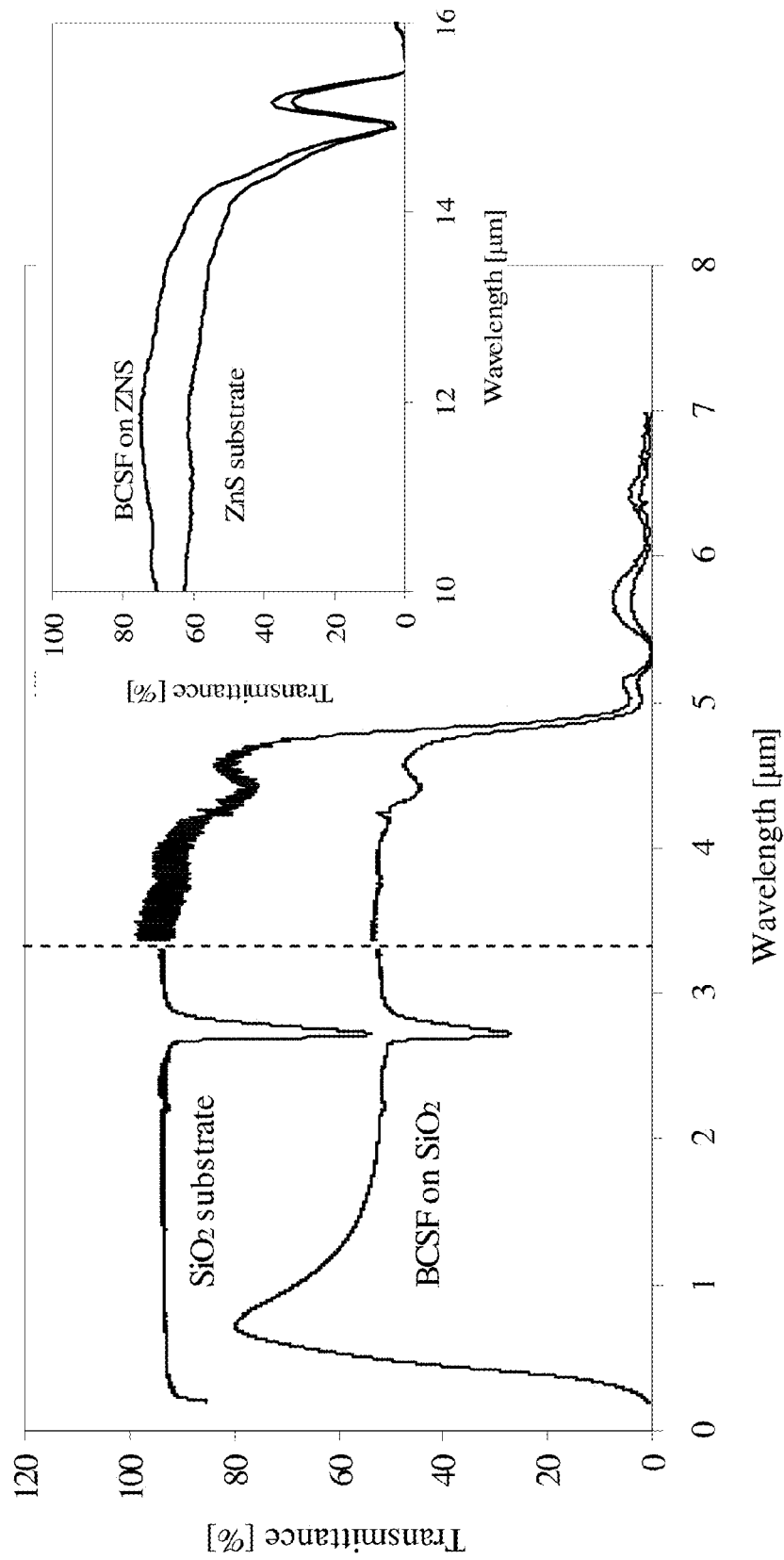
FIG. 2 is a plot of the transmittance of a 250 nm thick BCSF film on a 250 μm thick fused silica substrate. The transmittance of the blank silica substrate is also shown. The data for wavelengths <3.3 μm, to the left of the dotted line, were obtained with a spectrophotometer, and the data for wavelengths >3.3 μm were obtained with an FTIR system. The inset shows the transmittance of a 150 nm thick BCSF film on a 1 mm thick ZnS substrate demonstrating transparency to at least 13 μm. The transmittance on ZnS is higher when the film is present because the film acts like an anti-reflective coating.

The resulting films exhibited good transparency. FIG. 2 shows the transmittance of a 250 nm thick BCSF film on a 250 μm thick fused silica substrate. The peak transmittance is approximately 80% at a wavelength of 700 nm. The inset shows the infrared transmittance of the film on a ZnS substrate. As shown on the plot, the film transmits out to a wavelength of at least 13 μm where the transmittance is limited by that of the ZnS substrate.

Figure 3:
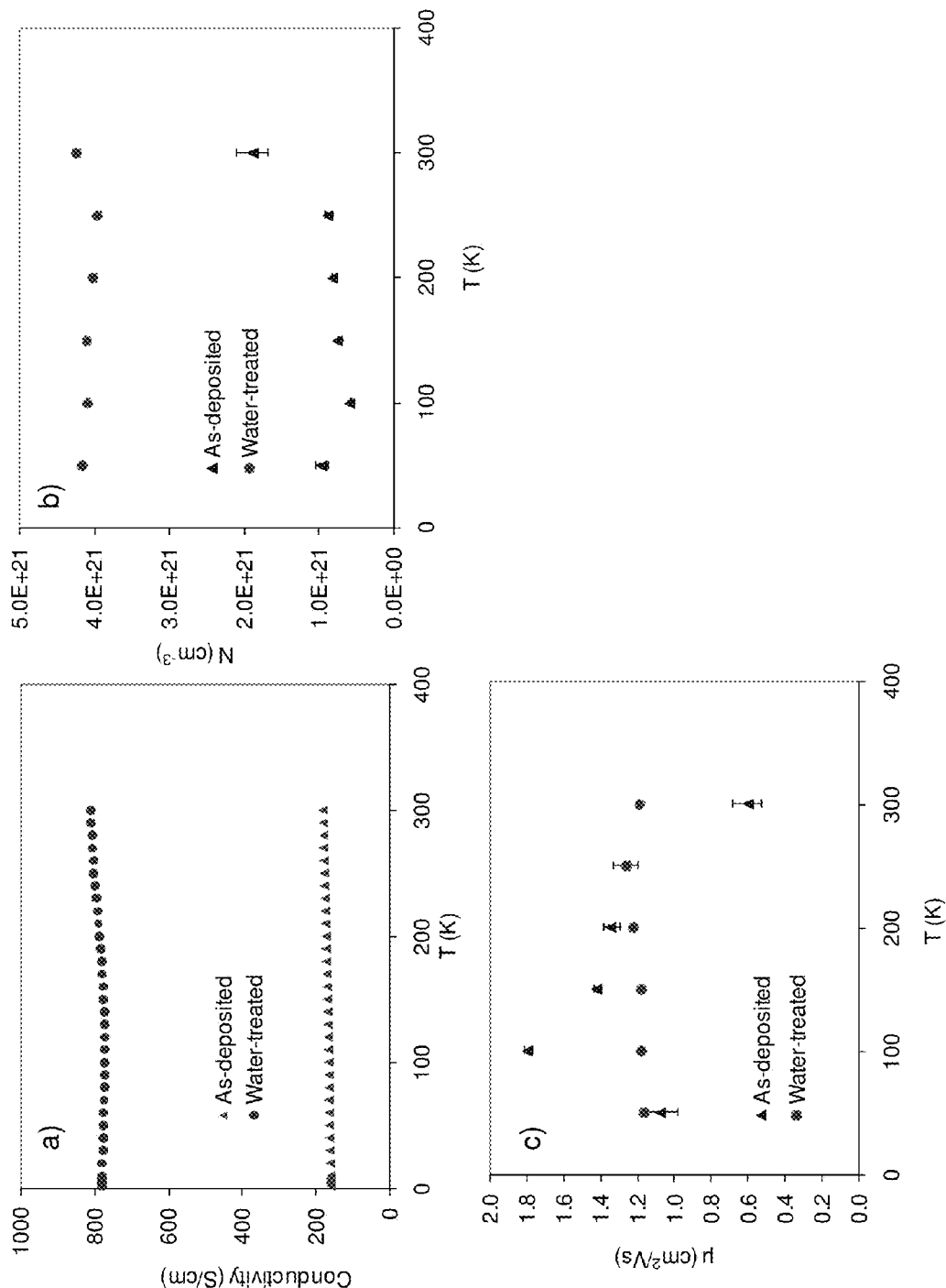
FIG. 3 contains Hall measurement data for a 380 nm thick BCSF film. The a) conductivity, b) carrier density, and c) calculated mobility are shown as a function of temperature.

FIG. 3 shows the electrical properties of 150 nm thick BCSF films. Data for both an as-deposited sample and a water-treated sample are shown on each plot. The water treatment consisted of soaking the sample in deionized water for 3-5 minutes, followed by a bake at 100° C. for at least 5 minutes. In plot a), the conductivity as a function of temperature is shown. The conductivity of the as-deposited sample is approximately 180 S/cm at T=300 K. Water treatment further enhances the conductivity by a factor of 3 to 4. The conductivity of the water-treated sample was approximately 800 S/cm at T=300 K. Plot b) shows the carrier concentration, and plot c) shows the hole mobility as a function of temperature. The carrier concentration is approximately $1\times10^{21}$ for the as-deposited sample and $4\times10^{21}$ for the water-treated sample. The mobility is approximately 1.2 $cm^2/Vs$ for both samples, although the variation as a function of temperature is greater for the as-deposited sample. It is evident from this data that the enhancement in conductivity for the water-treated sample is primarily a result of an increase in the concentration of charge carriers.

Figure 4:
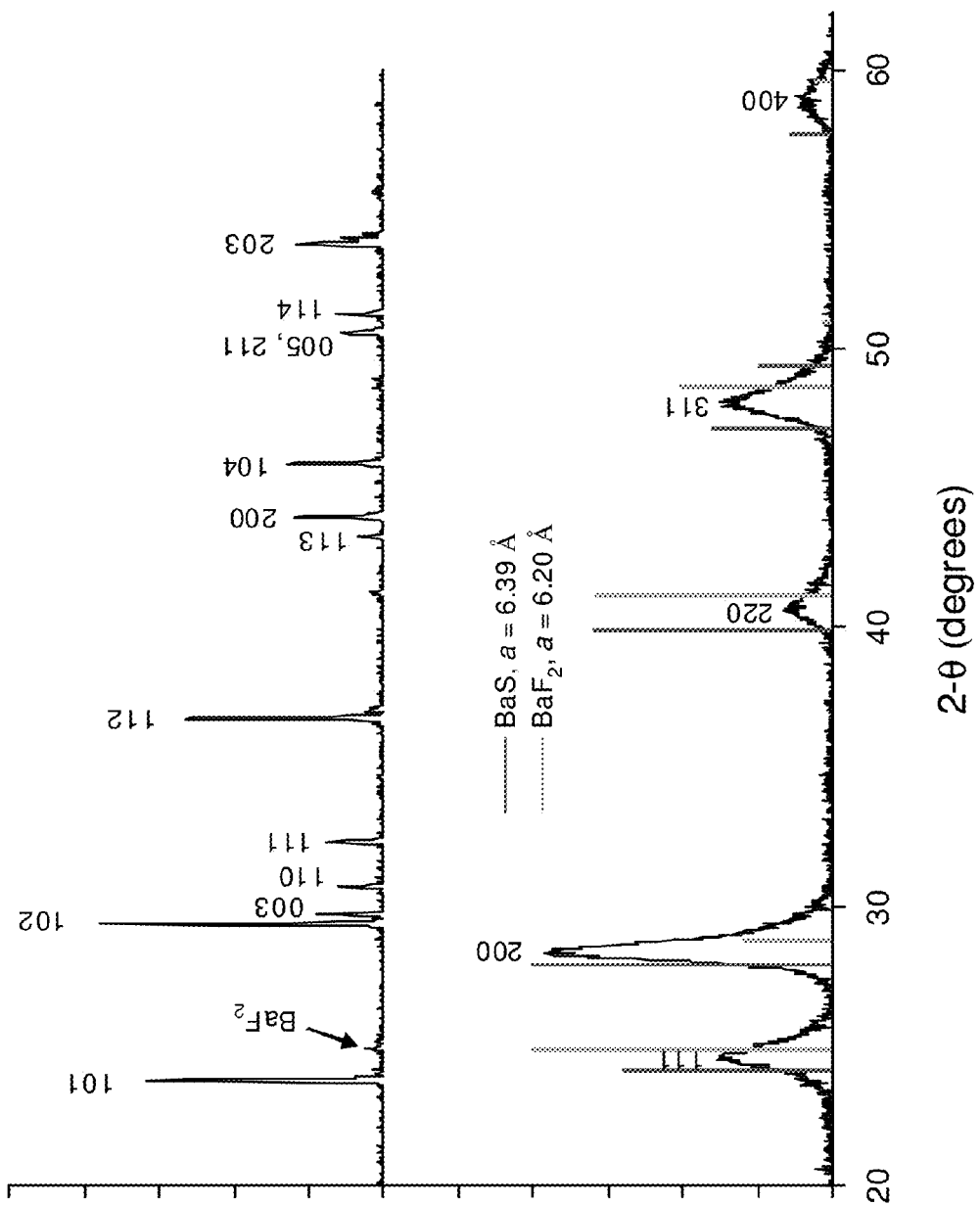
FIG. 4 shows powder XRD data for a 10 at. % K-doped bulk BCSF (upper plot) and for a 2.5 at. % K-doped BCSF film (lower plot).

Unlike the prior art, the films consist of a cubic phase rather than a P4/nmm phase. The phase of bulk BCSF and that of a film were compared by use of XRD. The upper plot in FIG. 4 shows powder XRD data for a 10 at. % K-doped bulk BCSF, and the lower plot shows data for a 2.5 at. % K-doped BCSF film. Note that, while the dopant concentration is different for the bulk and film samples shown, the XRD spectrum does not vary significantly with dopant concentrations in the 0-10 at. % range. This is true for both bulk and film samples. The data for bulk BCSF shows that the material is primarily the P4/nmm phase. Only a small amount of residual unreacted $BaF_2$ was observed.

The crystalline phase of the film is different than that of the bulk BCSF. The peaks for the P4/nmm phase are completely absent, while the new peaks are consistent with a face-centered cubic structure with a lattice parameter of a=6.27 Å. Two of the precursors also have face-centered cubic structure—$BaF_2$ and BaS—with lattice parameters of 6.20 Å and 6.39 Å respectively. The location and relative intensities of their peaks are shown in FIG. 3. The lattice parameter of the phase found in the BCSF film lies between these two. Based on a comparison of the intensity ratios for the $BaF_2$ and BaS FCC phases, we can infer that the space group of the observed cubic phase of BCSF is Fm3m.

BCSF on Plastic Substrate

Deposition can be carried out by RF magnetron sputtering in a sputter-up geometry onto a plastic substrate. The substrate was clipped onto a metal substrate holder that rotated during deposition to provide good uniformity. This process was carried out in an Ar atmosphere with a pressure of 5 mT and a flow rate of 20 sccm. An energy density of approximately 1 W/cm$^2$ was used. The resulting deposition rate was 9 Å/min. Films were deposited on PES substrates at a substrate temperature of 100° C. For deposition onto PET and polyimide substrates, deposition was carried out at room temperature.

The resulting films were transparent from approximately 400 nm into the near-infrared. The peak transmittance was approximately 55% at a wavelength of 640 nm. The transmittance falls off to a level of 10-15% throughout the near-infrared.

The conductivity of the films was measured at room temperature with a four-point probe. The conductivity of films on PES substrates was as high as 134 S/cm. The conductivity of the films on the PET and polyimide substrates was approximately 1 to 10 S/cm.

To determine the sign of the carriers, films were deposited on fused silica substrates using the same processing conditions used with the plastic substrates. The sign of the Seebeck coefficient was evaluated by applying a thermal gradient to the film and measuring the voltage between two probes at either end of a film. The sign of the Hall coefficient was also measured. Both measurements confirmed that the charge carriers are p-type, so it can be inferred that the films on plastic substrate also possess p-type conductivity.

Any plastic or polymeric substrate may be used. An opaque plastic substrate may be used for applications that do not require transparency yet benefits from other properties of plastic substrates such as low cost, light weight, or flexibility.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A barium copper sulfur fluoride (BCSF) transparent conductive thin film, made by the method comprising:
    forming a sputter target by either (a) hot pressing bulk BCSF or (b) hot pressing $Cu_2S$, BaS and $BaF_2$ powders in stoichiometric proportions; and
    sputtering a BCSF thin film from the target onto a substrate, wherein after sputtering, the BCSF thin film is soaked in water for at least 30 seconds and then heated at a temperature of at least 100° C. for at least 5 minutes;
    wherein the BCSF thin film has a conductivity of approximately 800 S/cm.

2. The BCSF transparent conductive thin film of claim 1, wherein the substrate is a plastic substrate.

3. The BCSF transparent conductive thin film of claim 2, wherein the plastic substrate is selected from the group consisting of polyethersulfone, polyethylene terephthalate, and polyimide substrates.

4. The BCSF transparent conductive thin film of claim 1, wherein a BCSF crystalline phase of the film is cubic in space group Fm3m.

* * * * *